(12) United States Patent
Pandey et al.

(10) Patent No.: US 10,983,445 B2
(45) Date of Patent: Apr. 20, 2021

(54) METHOD AND APPARATUS FOR MEASURING A PARAMETER OF INTEREST USING IMAGE PLANE DETECTION TECHNIQUES

(71) Applicant: ASML NETHERLANDS B.V., Veldhoven (NL)

(72) Inventors: Nitesh Pandey, Eindhoven (NL); Zili Zhou, Veldhoven (NL); Gerbrand Van Der Zouw, Waalre (NL); Arie Jeffrey Den Boef, Waalre (NL); Markus Gerardus Martinus Maria Van Kraaij, Eindhoven (NL); Armand Eugene Albert Koolen, Nuth (NL); Hugo Augustinus Joseph Cramer, Eindhoven (NL); Paul Christiaan Hinnen, Veldhoven (NL); Martinus Hubertus Maria Van Weert, 's-Hertogenbosch (NL); Anagnostis Tsiatmas, Eindhoven (NL); Shu-jin Wang, Velhoven (NL); Bastiaan Onne Fagginger Auer, Eindhoven (NL); Alok Verma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/268,564

(22) Filed: Feb. 6, 2019

(65) Prior Publication Data
US 2019/0250094 A1 Aug. 15, 2019

(30) Foreign Application Priority Data
Feb. 14, 2018 (EP) ..................................... 18156625

(51) Int. Cl.
*G03F 7/20* (2006.01)
*G01N 21/21* (2006.01)
*G01N 21/88* (2006.01)

(52) U.S. Cl.
CPC ......... *G03F 7/70616* (2013.01); *G01N 21/21* (2013.01); *G01N 21/8806* (2013.01);
(Continued)

(58) Field of Classification Search
CPC ................. G01N 21/21; G01N 21/211; G01N 2021/213; G01N 2021/214;
(Continued)

(56) References Cited

U.S. PATENT DOCUMENTS

| 4,482,250 A * | 11/1984 | Hirvonen | G01N 21/8986 356/369 |
| 8,681,413 B2 * | 3/2014 | Manassen | G01J 1/4257 359/291 |

(Continued)

FOREIGN PATENT DOCUMENTS

| TW | 201003332 | 1/2010 |
| WO | 2009156225 | 12/2009 |

(Continued)

OTHER PUBLICATIONS

International Search Report and Written Opinion issued in corresponding PCT Patent Application No. PCT/EP2019/051618, dated Feb. 20, 2019.

(Continued)

*Primary Examiner* — Gordon J Stock, Jr.
(74) *Attorney, Agent, or Firm* — Pillsbury Winthrop Shaw Pittman LLP

(57) ABSTRACT

An inspection apparatus, method, and system are described herein. An example inspection apparatus includes an optical system and an imaging system. The optical system may be
(Continued)

configured to output an illumination beam incident on a target including one or more features, the illumination beam polarized with a first polarization when incident on the target. The imaging system may be configured to obtain intensity data representing at least a portion of the illumination beam scattered by the one or more features, where the portion of the illumination beam has a second polarization orthogonal to the first polarization. The inspection apparatus may be further configured to generate image data representing an image of each of the feature(s) based on the intensity data, and determine a measurement of a parameter of interest associated with the feature(s) based on an amount of the portion of the illumination beam having the second polarization.

20 Claims, 10 Drawing Sheets

(52) U.S. Cl.
CPC ...... *G03F 7/70625* (2013.01); *G03F 7/70633* (2013.01); *G01N 2021/8848* (2013.01); *G03F 7/70191* (2013.01)

(58) Field of Classification Search
CPC ..... G01N 2021/216; G01N 2021/8848; G01N 21/8806; G01B 11/02; G01B 11/14; G03F 7/70616; G03F 7/70625; G03F 7/70633; G03F 7/70644; G03F 7/7065; G03F 7/70641
USPC ........ 356/364, 369, 399–401, 625, 635, 636
See application file for complete search history.

(56) References Cited

U.S. PATENT DOCUMENTS

| | | | | |
|---|---|---|---|---|
| 8,848,186 B2* | 9/2014 | Kandel | ............... | G01B 11/24 356/369 |
| 8,896,832 B2* | 11/2014 | Hill | ............... | G01N 21/474 356/364 |
| 8,908,175 B1* | 12/2014 | Kandel | ............... | G01N 21/211 356/237.4 |
| 9,551,939 B2* | 1/2017 | Mathijssen | ............... | G03F 9/7069 |
| 9,793,178 B2* | 10/2017 | Alonso | ............... | G01B 11/22 |
| 10,048,132 B2* | 8/2018 | Hill | ............... | G03F 7/70633 |
| 2003/0206298 A1 | 11/2003 | Bischoff et al. | | |
| 2004/0169861 A1 | 9/2004 | Mieher et al. | | |
| 2006/0033921 A1 | 2/2006 | Den Boef et al. | | |
| 2006/0066855 A1 | 3/2006 | Den Boef et al. | | |
| 2010/0201963 A1 | 8/2010 | Cramer et al. | | |
| 2010/0328655 A1 | 12/2010 | Den Boef | | |
| 2011/0027704 A1 | 2/2011 | Cramer et al. | | |
| 2011/0043791 A1 | 2/2011 | Smilde et al. | | |
| 2011/0069292 A1 | 3/2011 | Den Boef | | |
| 2011/0102753 A1 | 5/2011 | Van De Kerkhof et al. | | |
| 2011/0188020 A1 | 8/2011 | Den Boef | | |
| 2011/0310388 A1* | 12/2011 | Hill | ............... | G02B 27/145 356/369 |
| 2012/0044470 A1 | 2/2012 | Smilde et al. | | |
| 2012/0044495 A1* | 2/2012 | Straaijer | ............... | G03F 7/70625 356/369 |
| 2012/0123581 A1 | 5/2012 | Smilde et al. | | |
| 2012/0242970 A1 | 9/2012 | Smilde et al. | | |
| 2013/0141730 A1* | 6/2013 | Quintanilha | ............... | G02B 6/10 356/446 |
| 2013/0258310 A1 | 10/2013 | Smilde et al. | | |
| 2013/0271740 A1 | 10/2013 | Quintanilha | | |
| 2015/0355554 A1* | 12/2015 | Mathijssen | ............... | G03F 9/7046 355/67 |
| 2016/0025992 A1* | 1/2016 | Van Der Zouw | ............... | G01N 21/8806 250/216 |
| 2017/0242343 A1* | 8/2017 | Pandey | ............... | G01N 21/4788 |
| 2017/0255104 A1* | 9/2017 | Polo | ............... | G03F 9/7046 |
| 2018/0364590 A1* | 12/2018 | Van Der Schaar | ............... | G03F 7/70625 |

FOREIGN PATENT DOCUMENTS

| | | | | |
|---|---|---|---|---|
| WO | 2013178422 | 12/2013 | | |
| WO | WO-2017102327 A1 * | 6/2017 | ......... | G03F 7/70633 |

OTHER PUBLICATIONS

Extended European Search Report issued in corresponding European Patent Application No. 18156625.8, dated Jul. 31, 2018.
Taiwanese Office Action issued in corresponding Taiwanese Patent Application No. 108103735, dated Mar. 25, 2020.

* cited by examiner

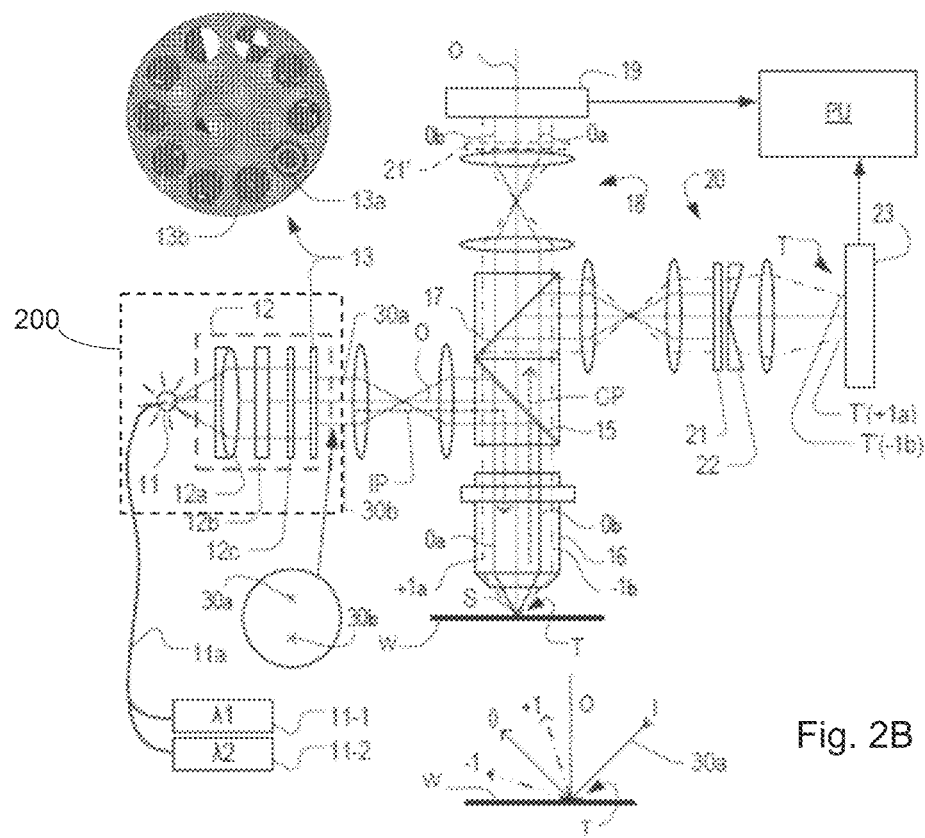
Fig. 2A
Fig. 2B
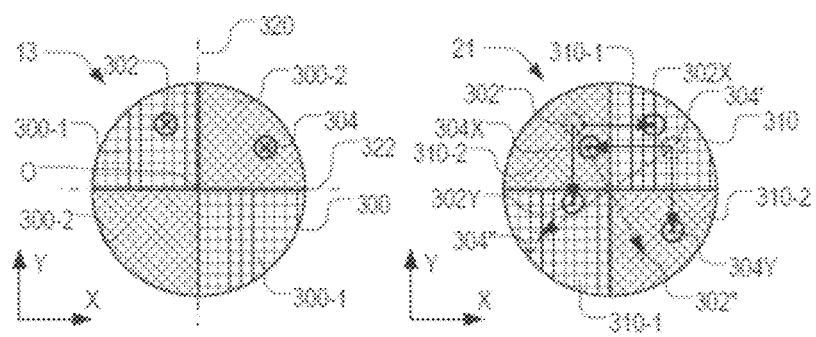
Fig. 3

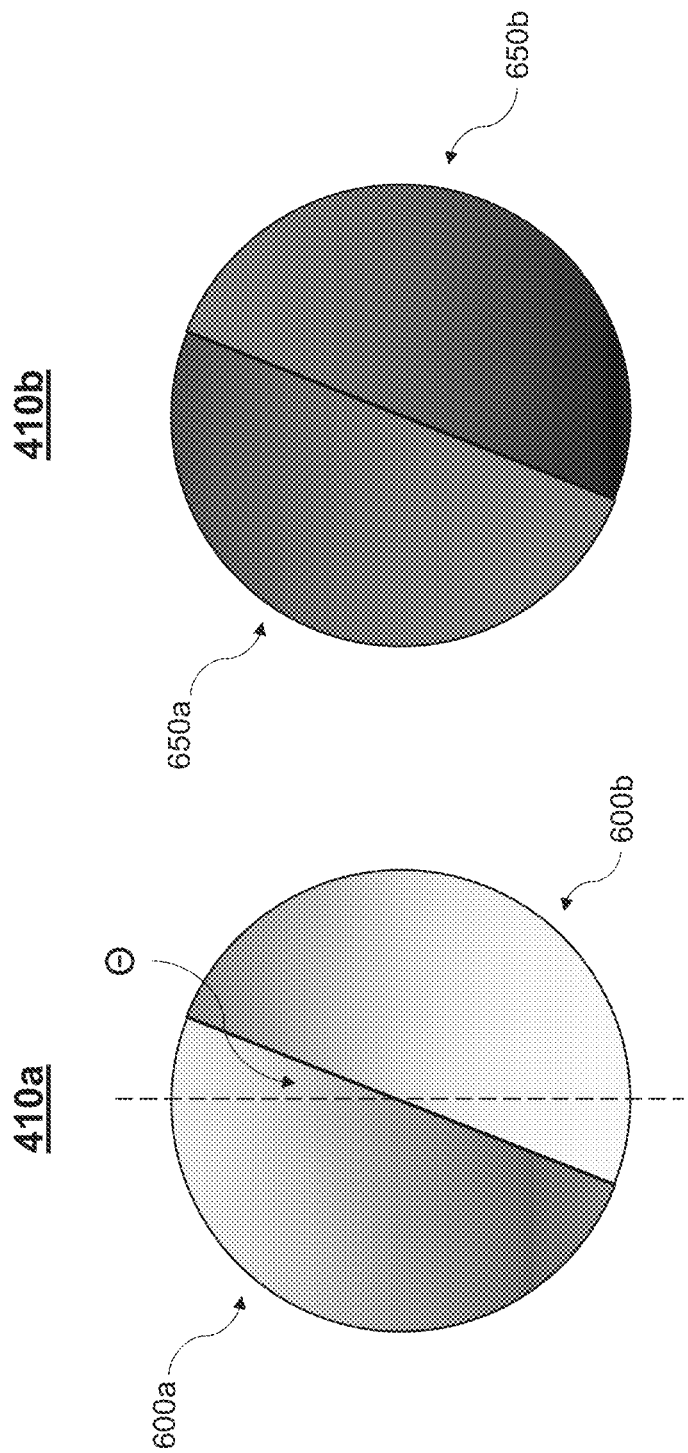

METHOD AND APPARATUS FOR MEASURING A PARAMETER OF INTEREST USING IMAGE PLANE DETECTION TECHNIQUES

This application claims the benefit of priority to European Patent Application No. EP18156625, filed Feb. 14, 2018, which is incorporated herein in its entirety by reference.

FIELD

The present description relates to methods and apparatus for metrology usable, for example, in the manufacture of devices by lithographic techniques and to methods of manufacturing devices using lithographic techniques. The description relates in particular to methods and apparatuses for measuring a parameter of interest using image plane detection techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (e.g., a resist) provided on the substrate. In general, a single substrate will contain a network of adjacent target portions that are successively patterned.

In lithographic processes, it is desirable frequently to make measurements of the structures created, such as for process control and verification. Various tools for making such measurements are known, including scanning electron microscopes, which are often used to measure critical dimension ("CD"), and specialized tools to measure overlay, the accuracy of alignment of two layers in a device. CD and overlay are two exemplary parameters of interest, also referred to herein interchangeably as properties of interest, which may be measured using some of the previously mentioned measuring tools. Recently, various forms of scatterometers have been developed for use in the lithographic field. These tools or devices direct a beam of radiation onto a target and measure one or more properties of the scattered radiation, which may be associated with one or more parameters of interest. For example, intensity at a single angle of reflection as a function of wavelength; intensity at one or more wavelengths as a function of reflected angle; or polarization as a function of reflected angle, may be used to obtain a diffraction "spectrum" from which a parameter of interest of the target can be determined.

Examples of known scatterometers include angle-resolved scatterometers of the type described in commonly assigned U.S. Patent Application Publication Nos. 2006/0033921 and 2010/0201963, the disclosures of which are incorporated herein by reference in their entireties. The targets used by such scatterometers are relatively large gratings (e.g., 40 μm by 40 μm), and the measurement beam generates a spot that is smaller than the grating (i.e., the grating is underfilled). In addition to measurement of feature shapes by reconstruction, diffraction based overlay can be measured using such apparatus, as described in commonly-assigned U.S. Patent Application Publication No. 2006/0066855, the disclosure of which is incorporated herein by reference in its entirety. Diffraction-based overlay metrology using dark-field imaging of the diffraction orders enables measurement of overlay and other parameters on smaller targets. These targets can be smaller than the illumination spot and may be surrounded by product structures on a substrate. The intensities that are derived from the adjacent product structures can efficiently be separated from the intensities that are derived from the overlay target with the dark-field detection in the image-plane.

Examples of dark field imaging metrology can be found in U.S. Patent Application Publication Nos. 2010/0328655 and 2011/0069292, the disclosures of which are hereby incorporated in their entirety by reference. Further developments of the technique have been described in U.S. Patent Application Publication Nos. 2011/0027704, 2011/0043791, 2011/0102753, 2012/0044470, 2012/0123581, 2012/0242970, 2013/0258310, and 2013/0271740, as well as in PCT Patent Application Publication No. WO 2013/178422, the disclosures of which are each incorporated herein in their entireties by reference. Typically, in these methods, it is desired to measure asymmetry as a property of the target structure. Targets can be designed so that a measurement of asymmetry can be used to obtain a measurement of various parameters of interest, such as, and without limitation, overlay, focus, and/or dose. Asymmetry of the structure is measured by detecting differences in intensity between opposite portions of the diffraction spectrum using the scatterometer. For example, the intensities of +1 and −1 diffraction orders may be compared, to obtain a measure of asymmetry.

In these known techniques, appropriate illumination modes and image detection modes are used to obtain the +1 and −1 diffraction orders from periodic structures (gratings) within the target. Each diffraction order may be captured in a separate pupil image or dark-field image, or techniques can be used to capture both +1 and −1 orders in different parts of a single pupil image or dark-field image, which reduces the time penalty associated with each measurement. In the dark-field imaging technique, composite targets comprising multiple gratings can be imaged simultaneously, to allow simultaneous capture of a diffraction order from differently biased gratings in different orientations. Using additionally a number of optical wedge elements as described in U.S. Patent Application Publication No. 2011/0102753, mentioned above, it is also possible in dark-field imaging to capture both +1 and −1 orders of one or more gratings in a single image. Images of the target using each portion of the diffraction spectrum appear spatially separated on the image sensor. This further reduces the time penalty associated with each measurement of the parameter of interest.

SUMMARY

In many cases, the asymmetry signals obtained are dependent to an unknown extent on process variables, not only the performance of a parameter of interest. In order to improve measurement accuracy of the parameter of interest, methods and apparatuses capable of harnessing the dark-field image results to measure co-polarized radiation are needed.

Features and advantages, as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

In an aspect, an inspection apparatus is provided including an optical system and an imaging system. The optical system may be configured to output an illumination beam incident on a target including one or more features. The illumination beam may be configured to include a first polarization when incident on the target. The imaging system may be configured to obtain intensity data representing at least a portion of the illumination beam scattered by the one or more features, where the portion of the illumination beam includes a second polarization orthogonal to the first polarization. The imaging system may be further configured to generate image data representing an image of each of the one or more features based on the intensity data, and determine a measurement of a parameter of interest associated with the one or more features based on an amount of the portion of the illumination beam having the second polarization.

In an aspect, a method is provided. The method may include outputting an illumination beam from an optical system to be incident on a target comprising one or more features; applying a first polarization to the illumination beam using a first filter component; applying a second polarization to at least a portion of the illumination beam that scatters off the one or more features using a second filter component, where the second filter component is located orthogonal to the first filter component; obtaining, by an imaging system, intensity data representing at least the portion of the illumination beam; generating image data representing an image of each of the one or more features based on the intensity data; and determining a measurement of a parameter of interest associated with the one or more features based on an amount of the portion of the illumination beam having the second polarization.

In an aspect, a system is provided. The system may include an optical system, a first filter component, a target, and a second filter component. The optical system may be configured to output an illumination beam. The first filter component may be configured to receive the illumination beam and apply a first polarization to the illumination beam such that the illumination beam, after passing through the first filter component, is polarized with the first polarization. The target may include one or more features, wherein the illumination beam having the first polarization is incident on the target, and at least a portion of the illumination beam scattered by the one or more features includes a second polarization orthogonal to the first polarization. The second filter component may be configured to receive the portion of the illumination beam including the second polarization, wherein the second filter component is configured to apply a second polarization to the portion of the illumination beam such that, after passing through the second filter component, a remaining portion of the illumination beam is associated with an amount of the remaining portion of the illumination beam that has the second polarization, and is representative of a parameter of interest associated with the one or more features.

BRIEF DESCRIPTION OF THE DRAWINGS/FIGURES

Embodiments of the invention will now be described, by way of example, with reference to the accompanying drawings in which:

FIG. 1 depicts a lithographic apparatus together with other apparatuses forming a production facility for devices (such as semiconductor devices), in accordance with various embodiments;

FIGS. 2A and 2B respectively illustrate schematically an inspection apparatus adapted to perform angle-resolved scatterometry and dark-field imaging inspection methods, in accordance with various embodiments, and an enlarged detail of the diffraction of incident radiation by a target grating in the apparatus, in accordance with various embodiments;

FIG. 3 illustrates schematically a pair of wavelength-selective filters used in the apparatus of FIG. 2, with superimposed illustrations of zero order and higher order diffracted radiation, in accordance with various embodiments;

FIGS. 6A and 6B are illustrative diagrams of two exemplary filter components used within the exemplary inspection apparatus of FIG. 4, in accordance with various embodiments;

DETAILED DESCRIPTION

Before describing embodiments of the invention in detail, it is instructive to present an example environment in which embodiments of the present invention may be implemented.

Figure 1:
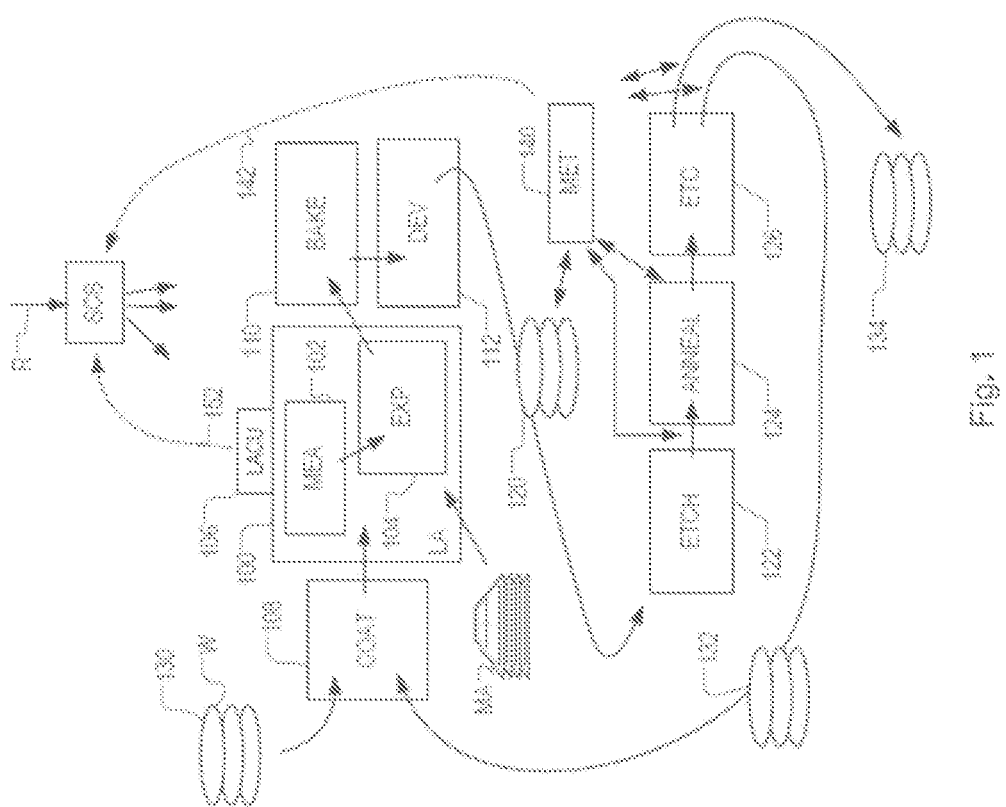

FIG. 1 depicts a lithographic apparatus together with other apparatuses forming a production facility for devices (such as semiconductor devices), in accordance with various embodiments. FIG. 1 at 100 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example that has great commercial significance today.

Within the lithographic apparatus or lithography apparatus (or "litho tool" for short) 100/LA, a measurement station MEA is shown at 102 and an exposure station EXP is shown at 104. A control unit LACU is shown at 106. In this example, each substrate W visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning device MA may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit ("LACU") controls the movements and measurements of various actuators and sensors, causing the apparatus LA to receive substrates W and patterning devices MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type that has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA for example is of a so-called dual stage type that has two substrate tables and two stations—an exposure station and a measurement station—between which the substrate tables can be exchanged.

Within the production facility, apparatus 100 forms part of a "litho cell" or "litho cluster" that contains also a coating apparatus 108/COAT for applying photosensitive resist and other coatings to substrates W for patterning by the apparatus 100. At an output side of apparatus 100, a baking apparatus 110/BAKE and developing apparatus 112/DEV are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R that provides in great detail a definition of the steps to be performed to create each patterned substrate. Supervisory control system SCS can also receive information 152 from the lithographic apparatus control unit for control or configuration of the system.

Once the pattern has been applied and developed in the litho cell, patterned substrates 120 are transferred to other processing apparatuses such as are illustrated at 122, 124, and 126. Various apparatuses implement a wide range of processing steps in a typical manufacturing facility. For the sake of example, apparatus 122/ETCH in this embodiment is an etching station, and apparatus 124/ANNEAL performs a post-etch annealing step. Further physical and/or chemical processing steps are applied in further apparatuses 126/ETC. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products 134 to be sent for dicing and packaging.

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the steps on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process that are very demanding in parameters such as resolution and overlay may be performed in a more advanced lithography tool than other layers that are less demanding. Therefore, some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure one or more properties of those substrates, such as one or more various parameters of interest. Various types of parameters of interest may include, but are not limited to, overlay errors between subsequent layers, line thicknesses, dose, and/or critical dimensions ("CD"). Accordingly, a manufacturing facility in which litho cell is located also includes metrology system 140/MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions that are "good," or non-faulty.

So, metrology apparatus 140 is provided for making measurements of one or more parameters of the products at desired stages in the manufacturing process. A common example of a metrology apparatus in a modern lithographic production facility is a scatterometer, for example an angle-resolved scatterometer or a spectroscopic scatterometer, and it may be applied to measure one or more properties of the developed substrates at 120 prior to etching in the apparatus 122. Using metrology apparatus 140, it may be determined, for example, that one or more parameters of interest, such as overlay and/or CD, do not meet specified accuracy requirements in the developed resist. Prior to the etching step, the opportunity exists to strip the developed resist and reprocess the substrates 120 through the litho cluster. Metrology results 142 from the apparatus 140 can be used to maintain accurate performance of the patterning operations in the litho cluster, by supervisory control system SCS and/or control unit LACU making small adjustments over time, thereby reducing or minimizing the risk of products being made out-of-specification, and requiring re-work. Of course, metrology apparatus 140 and/or other metrology apparatuses (not shown) can be applied to measure one or more properties of processed substrates 132, 134, and incoming substrates 130.

Example Inspection Apparatus

FIGS. 2A and 2B respectively illustrate schematically an inspection apparatus adapted to perform angle-resolved scatterometry and dark-field imaging inspection methods, in accordance with various embodiments, and an enlarged detail of the diffraction of incident radiation by a target grating in the apparatus, in accordance with various embodiments. FIG. 2A shows schematically elements of an inspection apparatus implementing so-called dark field imaging metrology. The apparatus may be a stand-alone device or incorporated in either lithographic apparatus LA (e.g., at the measurement station), or lithographic cell, as described above with reference to FIG. 1. A dotted line O represents an optical axis, which has several branches throughout the apparatus. A target grating structure T and diffracted rays are illustrated in more detail in FIG. 2B.

As described in the prior applications cited in the introduction, the dark-field imaging apparatus of FIG. 2A may be part of a multi-purpose angle-resolved scatterometer that may be used instead of or in addition to a spectroscopic scatterometer. In some embodiments, the inspection apparatus may include an optical system 200. Optical system 200 may include a radiation source 11 capable of emitting radiation, which may be conditioned by an illumination system 12. For example, illumination system 12 may include a collimating lens system 12a, a color filter 12b, a polarizer 12c and an aperture device 13. In this particular scenario, the output of optical system 200 may be an illumination beam having a particular wavelength (e.g., 400 nm), however the characteristics of the illumination beam may be adjusted in accordance with the measurements to be acquired. The conditioned radiation follows an illumination path IP, in which it is reflected by partially reflecting surface 15 and focused into a spot S on substrate W via a microscope objective lens 16. A metrology target T may be formed on substrate W. Lens 16, in one embodiment, has a high numerical aperture (NA), desirably at least 0.9 and more desirably at least 0.95. An immersion fluid can be used to obtain numerical apertures over 1 if desired.

Objective lens 16 in this example serves also to collect radiation that has been scattered by target T. Schematically, a collection path CP is shown for this returning radiation. The multi-purpose scatterometer may have two or more measurement branches in the collection path. The illustrated example includes a pupil imaging branch comprising pupil imaging optical system 18 and pupil image sensor 19. An imaging branch 20 is also shown, which will be described in more detail below. A beam splitter 17 provides radiation to pupil imaging optical system 18 and imaging branch 20. Furthermore, additional optical systems and branches may be included in a practical apparatus, for example to collect reference radiation for intensity normalization, for coarse imaging of capture targets, for focusing and/or so forth. Details of these can be found in the prior publications mentioned above.

Where a metrology target T is provided on substrate W, this may be a 1-D grating, which may be printed such that after development, bars may be formed of solid resist lines. Target T may be a 2-D grating, which may be printed such that, after development, the grating is formed of solid resist pillars or vias in the resist. The bars, pillars, and/or vias may alternatively be etched into the substrate. Each of these gratings is an example of a target structure whose one or more properties (e.g., one or more parameters of interest) may be investigated using the inspection apparatus. In the case of gratings, for example, the structure is periodic.

The various components of optical system 200, and in particular illumination system 12, can be adjustable to implement different metrology 'recipes' within the same apparatus. In addition to selecting wavelength (color) and/or polarization as characteristics of the illuminating radiation, optical system 200 and/or illumination system 12 can be adjusted to implement different illumination profiles. A plane of aperture device 13 is conjugate with a pupil plane of objective lens 16 and a plane of pupil image detector 19. Therefore, an illumination profile defined by aperture device 13 defines an angular distribution of radiation incident on substrate W in spot S. To implement different illumination profiles, an aperture device 13 can be provided in the illumination path. Aperture device 13 may comprise different apertures 13a, 13b mounted on a movable slide or wheel. It may alternatively comprise a programmable spatial light modulator. As a further alternative, optical fibers may be disposed at different locations in the illumination pupil plane and used selectively to deliver radiation or not deliver radiation at their respective locations. These variants are all discussed and exemplified in the documents cited above.

Depending on the illumination mode, imaging system 200 may cause example rays 30a to be output so that the angle of incidence is as shown at 'I' in FIG. 2B. The path of the zero order ray reflected by target T is labeled '0' (not to be confused with optical axis 'O'). Similarly, in the same illumination mode or in a second illumination mode, rays 30b can be output by imaging system 200, in which case the angles of incidence and reflection will be swapped compared with the first mode. In FIG. 2A, for instance, the zero order rays of the first and second example illumination modes are labeled 0a and 0b respectively.

As shown in more detail in FIG. 2B, target grating T as an example of a target structure is placed with substrate W normal to optical axis O of objective lens 16. In the case of an off-axis illumination profile, a ray 30a of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the illumination beam including, for example, illuminating rays 30a have a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging system 20, which may also be referred to interchangeably as imaging system 20, may form an image T' of the target on substrate W on sensor 23 (e.g. a CCD or CMOS sensor). An aperture stop 21 may be provided in a plane in the imaging branch of the collection path CP that is conjugate to a pupil plane of objective lens 16. Aperture stop 21 may also be called a pupil stop. Aperture stop 21 can take different forms, just as the illumination aperture can take different forms. Aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy.

The images captured by sensor 23 of image system 20 are output to image processor and controller PU, the function of which will depend on the particular type of measurements being performed. Imaging system 20, in one embodiment, may include image processor and controller PU, however in some embodiments, image processor and controller PU may be separate from and in communication with imaging system 20. For the present purpose, measurements of asymmetry of the target structure are performed. Asymmetry measurements can be combined with knowledge of the target structures to obtain measurements of one or more performance parameters (e.g., one or more parameters of interest) of the lithographic process used to form them. Parameters of interest that can be measured in this way include, for example, overlay, focus, CD, and/or dose. Special designs of targets may be provided to allow measurements of different parameters of interest to be made through the same asymmetry measurement method.

Referring again to FIG. 2B and illuminating rays 30a, +1 order diffracted rays from the target grating may enter objective lens 16 and may contribute to the image recorded at sensor 23. Rays 30b are incident at an angle opposite to rays 30a, and so the −1 order diffracted rays enter the objective and contribute to the image. Aperture stop 21 may be configured to block the zeroth order radiation when using off-axis illumination. As described in the prior publications mentioned above, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may be used instead and a modified, off-axis aperture stop 21 could be used to pass substantially only one first order of diffracted radiation to the sensor. In a further example, a pair of off-axis prisms 22 may be used in combination with an on-axis illumination mode. These prisms, also referred to herein as wedge elements, have the effect of diverting the diffracted rays (e.g., the +1 and −1 orders) to different locations on sensor 23 so that they can be detected and compared without the need for two sequential image capture steps. In FIG. 2A, for example, an image T'(+1a), made using +1 order diffraction from illuminating ray 30a, is spatially separated from an image T'(−1 b) made using −1 order diffraction from illuminating ray 30b. This technique is disclosed in U.S. Patent Application Publication No. 2011/0102753, the entire content of which is hereby incorporated by reference. Second ("2nd"), third ("3rd"), and higher order beams (not shown in FIGS. 2A and 2B) can be used in measurements, instead of or in addition to the first order beams. As a further variation, the off-axis illumination mode can be kept constant, while the target itself is rotated 180 degrees beneath objective lens 16 to capture images using the opposite diffraction orders.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

Dual-Wavelength Capture—Principle

FIG. 3 illustrates schematically a pair of wavelength-selective filters used in the apparatus of FIGS. 2A and 2B, with superimposed illustrations of zero order and higher order diffracted radiation, in accordance with various embodiments. FIG. 3 illustrates the use of segmented wavelength-selective filters to allow simultaneous capture of diffraction spectra at two wavelengths in the apparatus of FIG. 2A. A first filter 300 may be used in place of aperture device 13 in optical system 200. First filter 300 comprises first portions 300-1 having one or more first pass bands in the optical wavelength spectrum, and second portions 300-2 having one or more second pass bands. Such a filter can be fabricated, for example, by cutting two filters of different characteristics into segments, and gluing them together in the desired arrangement.

A second filter 310 may be used in place of aperture stop 21. Filter 310 may be very similar in form to filter 300, having first portions 310-1 that transmit radiation in the first wavelength range, while blocking radiation in the second wavelength range, and having second portions 310-1 that transmit radiation in the second wavelength range while blocking radiation in the first wavelength range.

Illustrated in FIG. 3 are two example illuminating rays 302 and 304 passing through filter 300. Illuminating rays 302 and 304, in one embodiment, may correspond to a portion of an illumination beam output by optical system 200. Corresponding positions 302' and 304' are indicated on the drawing of the second filter 310. In the illustrative embodiment, second filter 310 is arranged such that its first portions 310-1 lie in portions of the pupil plane diametrically opposite to the second portions 300-1 of first filter 300, with regard to the optical axis O that passes through a center of the filter. Similarly, in the illustrative embodiment, second portions 310-1 of second filter 310 lie in portions of the pupil plane diametrically opposite to first portions 300-1 of first filter 300. The zero order reflected rays from illuminating rays 302, 304 arrive at positions 302" and 304" on second filter 310. No matter the angular position of the illuminating rays passing through first portions of filter 300, the corresponding zero order reflected rays will be blocked by second portions of filter 310. Similarly, no matter the angular position of illuminating rays passing through second portions of filter 300, they will be blocked by first portions of filter 310.

Considering now the first order diffracted radiation scattered by target T (FIG. 2B), 302X indicates the position of a diffracted ray from the illuminating ray 302 of the illumination beam upon encountering a grating structure that is periodic in the X direction. Similarly, 302Y indicates the position of a diffracted ray from the illuminating ray 302, upon encountering a grating structure that is periodic in the Y direction. Further, 304X and 304Y indicate diffracted rays from illuminating ray 304. Each of these diffracted rays falls on a portion of second filter 310 having substantially same wavelength characteristics (e.g., a difference between the wavelengths being less than 5%), as the portion through which the illuminating ray passed in first filter 300. Accordingly, in a collection optical system of the scatterometer, rays of different wavelengths can be transmitted simultaneously, passing the higher order diffracted rays, and simultaneously blocking the zero order reflected rays for all wavelengths and angular positions.

It will be seen that, with regard to an optical axis of the collection optical system, each segmented wavelength-selective filter 300, 310 has first portions positioned diametrically opposite one another. With regard to a first line of symmetry 320 transverse to a first direction of periodicity of the target structure, for example, the X direction or the Y direction, each segmented wavelength-selective filter 300, 310 has first portions symmetrically opposite second portions. With regard also to a second line of symmetry 322 transverse to a second direction of periodicity of the structure, the segmented wavelength-selective filter again has first portions symmetrically opposite second portions.

The particular segmentation of the filters illustrated in FIG. 3 is based on the segmented illumination aperture described in more detail in U.S. Patent Application Publication No. 2010/0201963, mentioned above. Instead of simply having transmissive and opaque portions, however, the segmented wavelength-selective filter of the present disclosure has first portions and second portions with complementary transmission spectra. By arranging a second such filter in the collection path CP with appropriate orientation, the benefits of the known segmented aperture can be obtained for two wavelengths simultaneously. Other arrangements of segmentation may be applied, if desired. For example, for some applications it might be sufficient to make a filter of two halves.

Instead of providing the wavelength-selective filters in place of the aperture stop and/or pupil stop, they can be mounted separately, in series with a conventional aperture device and/or field stop. Color filter 12b is another possible location, for example.

Referring again to FIG. 2A, in the illustrative embodiment, radiation source 11 of optical system 200 can be implemented by a pair of narrowband radiation sources 11-1 and 11-2 and a common delivery system, such as an optical fiber 11a. While radiation sources 11-1 and 11-2, as well as optical fiber 11a are shown to be external to optical system 200, persons of ordinary skill in the art will recognize that this is merely exemplary, and in some embodiments, optical system 200 includes one or more of radiation sources 11-1 and 11-2, as well as optical fiber 11a. First radiation source 11-1 in this example can be tuned to a range of wavelengths in at least a first wavelength range, while second radiation source 11-2 can be tuned to a range of wavelengths in at least a second wavelength range.

Generally speaking, there are various ways with which a parameter of interest, such as overlay, associated with one or more features of a target may be measured using a metrology tool. For instance, the parameter of interest may be measured in an image mode or a pupil mode, as known to those of ordinary skill in the art.

Figure 4:
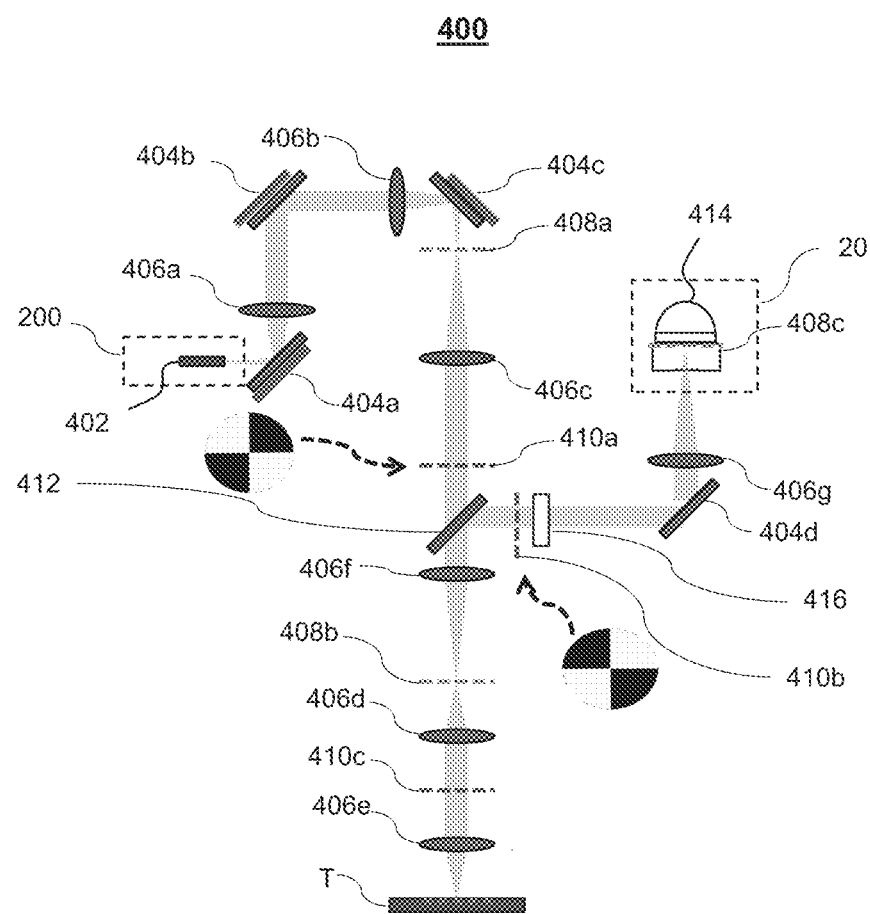
FIG. 4 is an illustrative diagram of an exemplary inspection apparatus, in accordance with various embodiments.

FIG. 4 is an illustrative diagram of an exemplary inspection apparatus, in accordance with various embodiments. In non-limiting embodiment, inspection apparatus 400, which may correspond to one or more portions/components of lithographic apparatus LA of FIG. 1, may include optical system 200, such as optical system 200 of FIG. 2A. Optical system 200 includes, in the illustrative non-limiting embodiment, a source 402, which may serve as a mechanism for outputting an illumination beam. Source 402, for instance, may produce the illumination beam, which may be emitted by optical system 200. As described herein, illumination beam may also be referred to interchangeably as "light," "radiation," and/or "radiation beam." As an illustrative example, source 402 may correspond to an optical fiber or other illumination source, which may be a point source of approximately 400 micrometers in diameter. However, persons of ordinary skill in the art will recognize that this is merely exemplary. Furthermore, while optical system 200 is not shown to include lens(es) 12*a-c* or aperture 13, this is merely for simplicity.

Inspection apparatus 400 may also include reflection components 404*a-d* at various locations and arranged in various orientations. Reflection components 404*a-d* may be configured to cause the illumination beam emitted optical system 200 generated by source 402 to be directed in a particular direction, and thus to interact with various additional components of apparatus 400. For example, reflection component 404*a* may receive the illumination beam output by optical system 200, and may cause the illumination beam to be re-directed from an angle of incidence to an angle of reflection with minimal absorption (e.g., less than 5% absorption). In some embodiments, reflection components 404*a-d* may be designed to cause radiation to be reflected at a 90-degree angle with respect to an angle of incidence, however this is merely illustrative.

Inspection apparatus 400 may also include lenses 406*a-g*, collectively referred to herein, for example, as lens(es) 406. Each lens 406 is configured to focus the radiation to have a diameter greater than, equal to, or less than the initial diameter of the radiation when emitted from source 402. For example, lens 406*a* may have a 10 cm focal length. In some embodiments, each of lenses 406*a-g* may have a substantially similar focal length, however that is not required.

After reflecting off reflection component 404*a*, and passing through lens 406*a*, the illumination beam may then reflect off reflection component 404*b*, pass through lens 406*b*, and reflect off reflection component 404*c*. The illumination beam, after reflecting off reflection component 404*c*, arrives at field plane 408*a*. Field plane 408*a* may represent an exact image of source 402. Field plane 408*a* may correspond, in one embodiment, to an aperture capable of being used to select a size of the beam to incident target T. Field plane 408*a* may allow for an imaging device (e.g., pupil image detector 19) to obtain an image of the illumination beam prior to, or after, passing through field plane 408*a*. After passing through field plane 408*a*, the illumination beam may further pass through another lens 406*c*, which creates the first pupil plane, where a filter component may be placed. For instance, as seen in FIG. 4, the illumination beam may be directed, after passing through lens 406*c*, to first filter component 410*a*.

First filter component 410*a*, which is described in greater detail below, may be configured to apply a first filtering configuration to the illumination beam to filter the radiation in a first manner. For example, first filter component 410*a* may be configured to polarize the radiation passing through by applying a first polarizing configuration to the illumination beam. In some embodiments, an illumination mode selector may also be included within inspection apparatus 400 prior to the illumination being incident on first filter component 410*a*. The illumination mode selector may be configured to determine how the illumination beam is going to be directed when applied to a target T. For example, the illumination mode selector may allow for a selection of a particular angle, or set of angles, with which the illumination beam will incident target T. The illumination mode selector, for instance, may include a set of apertures operable to cause the illumination beam, upon receipt by the illumination mode selector, to be incident target T at a particular angle of incidence.

In some embodiments, first filter component 410*a* may include four equally sized segments, each having one of two filtering configurations. For example, first filter component 410*a* may correspond to a polarizing aperture including a first segment having a first polarization that polarizes radiation such that radiation passing through the first segment has the first polarization, a second segment having a second polarization that polarizes radiation such that radiation passing through the second segment has the second polarization, a third segment having the second polarization, and a fourth segment having the first polarization. In the example embodiment, the first and fourth segments are point symmetric with respect to a center of component 410*a*, and the second and third segments are point symmetric with respect to the center. However, persons of ordinary skill in the art, as further detailed below, may recognize that additional filtering techniques may be implemented for first filter component 410*a*. Furthermore, in some embodiments, first filter component 410*a* may be referred to herein interchangeably as an aperture and/or a polarizer.

After passing through first filter component 410*a*, the filtered illumination beam (e.g., polarized illumination beam) may pass through a beam splitter 412, configured to allow at least a portion of the illumination beam to continue in the same direction towards target T. The illumination beam may pass through another lens 406*f*, an additional field plane 408*b*, which may be substantially similar to field plane 408*a*, and an additional lens 406*d*, before reaching another filter component 410*c*. After passing through filter component 410*c*, the filtered illumination beam may pass through a lens 406*e*, which in some embodiments may correspond to a microscope objective lens configured to make an image on target T (e.g., a wafer). For example, lens 406*e* may be substantially similar to microscope objective lens 16 of FIG. 2A.

In the illustrative embodiment, target T may include one or more features (e.g., structures protruding upwards away from a surface of target T, structures extending into target T, such as trenches, and/or any other structure), with which the filtered illumination beam may scatter off of. The filtered illumination beam may interact with the various features of target T, and may scatter back towards lens 406*e*. In some embodiments, at target T, the filtered illumination beam is converted from a first state to a second state. For instance, the illumination beam may be s-polarized after passing through first filter component 410*a*. Upon interaction with target T, the s-polarized illumination beam may be converted to be p-polarized, as is known by those of ordinary skill in the art. Similarly, if the illumination beam were filtered at first filter component 410*a* such that it was p-polarized, then upon being incident with target T, the illumination beam would be converted to be s-polarized.

After scattering off one or more features of target T, the converted illumination beam, or at least a portion thereof, may traverse some of the same optics of the filtered illumination beam—lens 406*e*, filter component 410*c*, lens 406*d*, field plane 408*b*, and lens 406*f*, until reaching beam splitter 412. At beam splitter 412, the converted illumination beam may be redirected in a direction perpendicular to that of the angle of incidence of the converted illumination beam. For example, if the converted illumination beam incidences beam splitter 412 at 0-degrees, the reflected converted illumination beam may travel at 90-degrees.

Following beam splitter 412, located along the path of the reflected converted illumination beam, and arranged perpendicular to first filter component 410*a*, may be a second filter component 410*b*. Second filter component 410*b*, which is described in greater detail below, may be substantially similar to first filter component 410*a*, with the exception that second filter component 410*b* filters incoming radiation in an opposite manner to that of first filter component 410a. For example, if first filter component 410a applies a first filtering configuration (e.g., a first polarization scheme) to the incoming illumination beam (e.g., the illumination beam), then second filter component 410b applies a second filtering configuration (e.g., a second polarization scheme) to its incoming radiation (e.g., the reflected converted illumination beam). By applying an orthogonal filtering configuration to the reflected converted illumination beam, any symmetric components of the illumination beam may be cancelled out, and all that may remain is asymmetric components of the illumination beam. The asymmetric components may represent information associated with a parameter of interest associated with the one or more features (e.g., overlay, CD, etc.). In other words, the combination, as illustrated, of first filter component 410a and second filter component 410b blocks out any s-polarized to s-polarized radiation, as well as any p-polarized to p-polarized radiation, leaving only s-polarized to p-polarized and/or p-polarized to s-polarized radiation.

In some embodiments, second filter component 410b may include four equally sized segments, each having one of two filtering configurations. For example, second filter component 410b may correspond to a polarizing aperture including a first segment having the second polarization such that it polarizes radiation such that radiation passing through the first segment has the second polarization (as described above), a second segment having the first polarization such that it polarizes radiation such that radiation passing through the second segment has the first polarization (as described above), a third segment having the first polarization, and a fourth segment having the second polarization, where the first and fourth segments are point symmetric with respect to a center of component 410b, and where the second and third segments are point symmetric with respect to the center. In this particular embodiment, the first segment of second filter component 410b has an opposite polarization to that of the first segment of first filter component 410a. However, persons of ordinary skill in the art, as further detailed below, may recognize that additional filtering techniques may be implemented for second filter component 410b. Furthermore, in some embodiments, second filter component 410b may be referred to herein interchangeably as an aperture and/or a polarizer.

In some embodiments, wedge element 416 may be included after second filter component 410b. Wedge element 416, in one embodiment, may be configured and arranged such that it is in alignment with second filter component 410b. In other words, a portion of radiation passing through one segment of second filter component 410b will be configured to pass through a corresponding wedge quarter (e.g., wedge quarters 416a-d) of wedge element 416. Wedge element 416, as described in greater detail below, may be configured to redirect, also referred to as offset, portions of the illumination beam passing through each segment of second filter component 410b and thus a corresponding wedge quarter of wedge element 416. This facilitates the radiation, when seen by imaging device 414 of imaging system 20, to be separated out in an image represented by image data generated by imaging system 20. Furthermore, as seen within FIG. 4, following wedge element 416 may be a reflecting component 404d and a lens 406g, which may direct the co-polarized illumination beam (e.g., the reflected converted illumination beam after passing through second filter component 410b) towards imaging device 414. In some embodiments, imaging system 20 may include an additional field plane 408c, which may be located substantially proximate to imaging device 414 to resolve the pupil image. Imaging device 414, in some embodiments, may be a CCD imaging camera, which may allow for images associated with each filtering segment of filter components 410a and 410b to be rendered.

In some embodiments, imaging system 20 may be configured to obtain intensity data representing at least a portion of the illumination beam, which in this particular scenario may correspond to the reflected converted illumination beam. For instance, the asymmetric components of the illumination beam (if there are any), may be directed to imaging system 20, and in particular to imaging device 414. Imaging system 20, and in particular imaging device 414, may be configured to receive radiation representative of a portion of the illumination beam that passes through second filter component 410b. This intensity data, therefore, is representative of the cross-polarized radiation, and thus the amount of asymmetry associated with the one or more features of target T. Upon receiving the intensity data, imaging system 20 may generate image data representing an image of each of the one or more features that the incident illumination beam scatters off of may be generated based on the intensity data. Here again, the intensity data is related to the asymmetric components of the illumination beam received by imaging system 20. In some embodiments, imaging system 20 may include imaging device 414, operable to receive the incoming radiation, one or more processors, and memory including instructions to execute one or more computer programs. For example, imaging system 20 may be configured such that, upon receipt of intensity data associated with the illumination beam, a computer program stored within memory is executed by the one or more processors that generates image data representing an image, where the image is a representation of the one or more features of target T with which the illumination beam scattered off of. Using the image data, the one or more processors may access an additional computer program, or may provide the image data to one or more additional devices/systems, to measure a parameter of interest associated with the one or more features. For example, the image data may be used to measure an amount of overlay associated with the one or more features.

Figure 5B:
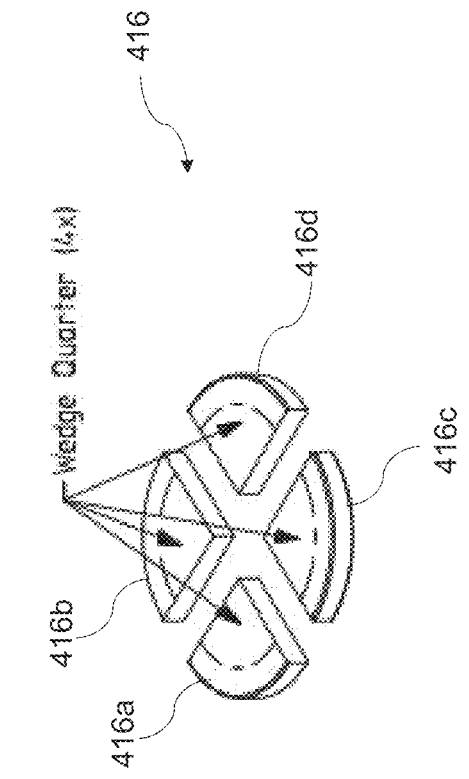
FIGS. 5A and 5B are illustrative diagrams of a wedge element employed within the exemplary inspection apparatus of FIG. 4, in accordance with various embodiments.
Figure 5A:
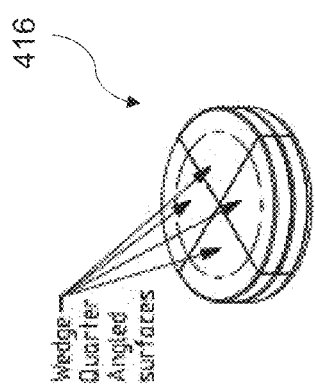

FIGS. 5A and 5B are illustrative diagrams of a wedge element employed within the exemplary inspection apparatus of FIG. 4, in accordance with various embodiments. Filter components 410a, 410b, which may be referred to collectively as filter component(s) 410, may in some embodiments be substantially circular. In this particular scenario, wedge element 416 may also be substantially circular. Referring to FIG. 5A and scenario 500, wedge element 416, which may also be referred to as an optical wedge element, as described in U.S. Patent Application Publication No. 2011/0102753, as mentioned above, may allow for dark-field imaging to capture one or more of 0, +1, −1 order reflected radiation of one or more features of target T in a single image. For instance, wedge element 416 may correspond to one or more prisms that divert the diffracted rays (e.g., the 0 order and/or +1 and −1 orders) to different locations on imaging device 414 of imaging system 20 so that the diffracted rays can be detected and compared without the need for two sequential image capture steps.

As mentioned above, wedge element 416 may include four wedge quarters, 416a-d, as seen within scenario 550 of FIG. 5B. Each of wedge quarters 416a-d may correspond to one quadrant of filter component 410b. Wedge quarters 416a-d may each, in some embodiment, be a small prism or other structure capable of redirecting radiation falling on a corresponding pupil into a corresponding one of four quadrants of an image, in slightly different directions. As a result, imaging device 414 may be configured to display four separate images, each one being associated with one of the wedge quarters 416a-d, as seen below with reference to FIG. 8A.

Generally speaking, an incoming radiation beam, or radiation wave, may be incident on a filter component at a first location of first filter component 410a. For example, the incident radiation beam may be incident on first filter component 410a at a location (X1, Y1) in a two-dimensional plane. The outgoing wave, therefore, will be located at a point symmetric with respect to the origin of first filter component 410a (e.g., location (–X1, –Y1). For a cross-polarization measurement, the polarization of the incoming wave at the point of incidence (e.g., location (X1, Y1) is orthogonal to the outgoing point (e.g., location (–X1, –Y1). By harnessing these properties of the illumination beam and filter components, a measurement of a parameter of interest, such as overlay and/or CD, may be made. For instance, by illuminating a target in an opposite direction with respect to a pair of points, information associated with the asymmetry of the target may be determined by the filtering being point-symmetric.

FIGS. 6A and 6B are illustrative diagrams of two exemplary filter components used within the exemplary lithography apparatus of FIG. 4, in accordance with various embodiments. As seen within FIGS. 6A and 6B, an exemplary first filter component 410a and an exemplary second filter component 410b are shown. First filter component 410a, in the illustrative embodiment, includes a first half 600a and a second half 600b. Second filter component 410b, in the illustrative embodiment, includes a first half 650a and a second half 650b. In some embodiments, first filter component 410a may correspond to an incident polarization filter, whereas second filter component 410b may correspond to an outgoing polarization filter.

As an example, first half 600a of first filter component 410a may include an arbitrary polarization design as seen by the color gradient within first half 600a. In this particular scenario, each point within first half 600a may have a different polarization. For example, the different types of polarization for each point within first half 600a may include, but are not limited to, linear polarization, circular polarization, and elliptical polarization.

Continuing the aforementioned example, second half 600b may include a polarization design also having a color gradient, where the polarization design of second half 600b is point symmetric with respect to first half 600a. Therefore, if a point (X1, Y1) in first half 600a has a first polarization, a symmetric point, (–X1, –Y1) with respect to an origin/center of first filter component 410a, has a second polarization orthogonal to the first polarization.

Second filter component 410b, in the illustrative embodiment, includes a first half 650a and a second half 650b. First half 650a and second half 650b may be substantially similar to first half 600a and second half 600b with the exception that first half 650a and second half 650b include a corresponding orthogonal polarization state with respect to first half 600a and second half 600b. By employing this orthogonal polarization state, any radiation detected by imaging device 414 is a result of asymmetry in the one or more features of target T.

In some embodiments, first filter component 410a may be offset at an angle Θ with respect to a central axis of filter component 410a. Θ, in this scenario, may be any value between 0-degrees and 180-degrees. Furthermore, in this scenario, second filter component 410a is also angled at angle Θ, albeit second filter component 410b is located at 90-degrees with respect to a position of first filter component 410a, as seen above with reference to FIG. 4.

Figure 7B:
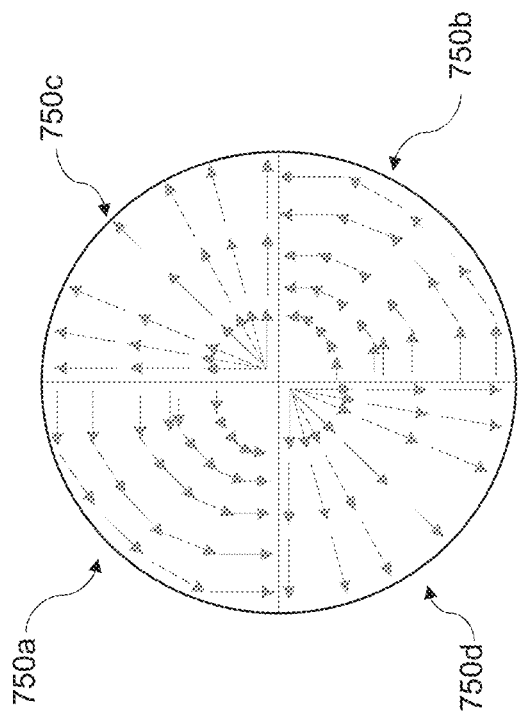
FIGS. 7A and 7B are illustrative diagrams of another two exemplary filter components used within the exemplary inspection apparatus of FIG. 4, in accordance with various embodiments.
Figure 7A:
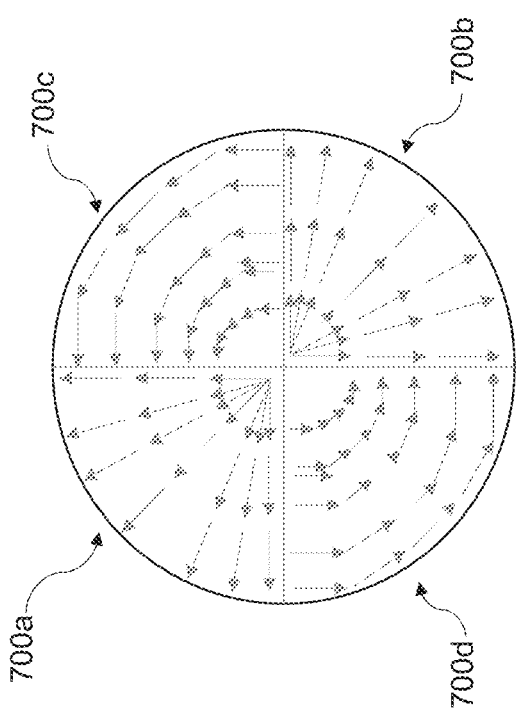

FIGS. 7A and 7B are illustrative diagrams of another two exemplary filter components used within the exemplary lithography apparatus of FIG. 4, in accordance with various embodiments. In the non-limiting illustrative embodiment, first filter component 410a and second filter component 410b are shown. First filter component 410a, in one embodiment, may be segmented into four segments, first segment 700a, second segment 700b, third segment 700c, and fourth segment 700d. Similarly, second filter component 410b, in one embodiment, may be segmented into four segments, first segment 750a, second segment 750b, third segment 750c, and fourth segment 750d. Segments 700a-d and 750a-d may each be substantially similar in size and shape, and may be formed using micropolarizer arrays (e.g., an assembly of small polarizers) and/or using spatial radiation modulators. In the example embodiment, first filter component 410a may correspond to an "illumination polarizer," while second filter component 410b may correspond to a "detection polarizer."

In one embodiment, first segment 700a of first filter component 410a may be configured such that a first polarization scheme is employed. For example, first segment 700a may include a radial polarization profile. The radial polarization profile may be constructed such that p-polarized radiation is generated to be incident on target T. Second segment 700b of first filter component 410a may similarly include the radial polarization profile, while also being located symmetrically opposite of first segment 700a within first filter component 410a. Third segment 700c of first filter component 410a, in one embodiment, may be configured such that a second polarization scheme is employed. For example, third segment 700c may include a tangential polarization profile. The tangential polarization profile may be constructed such that s-polarized radiation is generated to be incident on target T. Fourth segment 700d of first filter component 410a may similarly include the tangential polarization profile, while also being located symmetrically opposite of third segment 700c within first filter component 410a.

In one embodiment, first segment 750a of second filter component 410b may be configured such that the second polarization scheme is employed. For example, first segment 750a may include the tangential polarization profile. Second segment 750b of second filter component 410b may similarly include the tangential polarization profile, while also being located symmetrically opposite of first segment 750b within second filter component 410b. Third segment 700c of second filter component 410b, in one embodiment, may be configured such that the first polarization scheme is employed. For example, third segment 750c may include the radial polarization profile. Fourth segment 750d of second filter component 410b may similarly include the radial polarization profile, while also being located symmetrically opposite of third segment 750c within second filter component 410b.

Figure 8B:
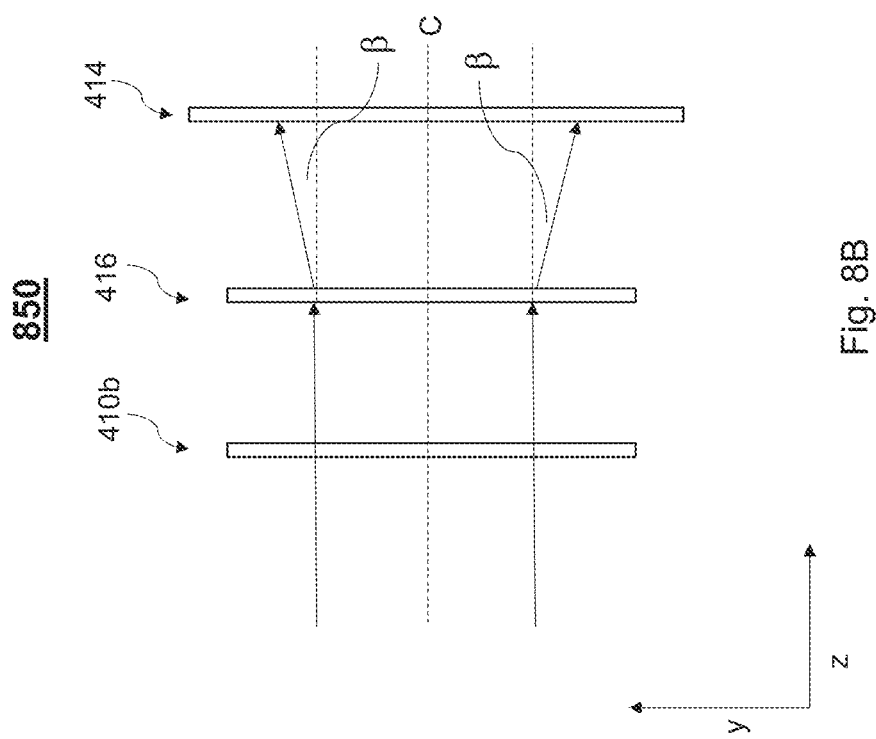
FIG. 8B is an illustrative diagram of an exemplary path of a particle being offset by a wedge element after passing through a filter component, in accordance with various embodiments.
Figure 8A:
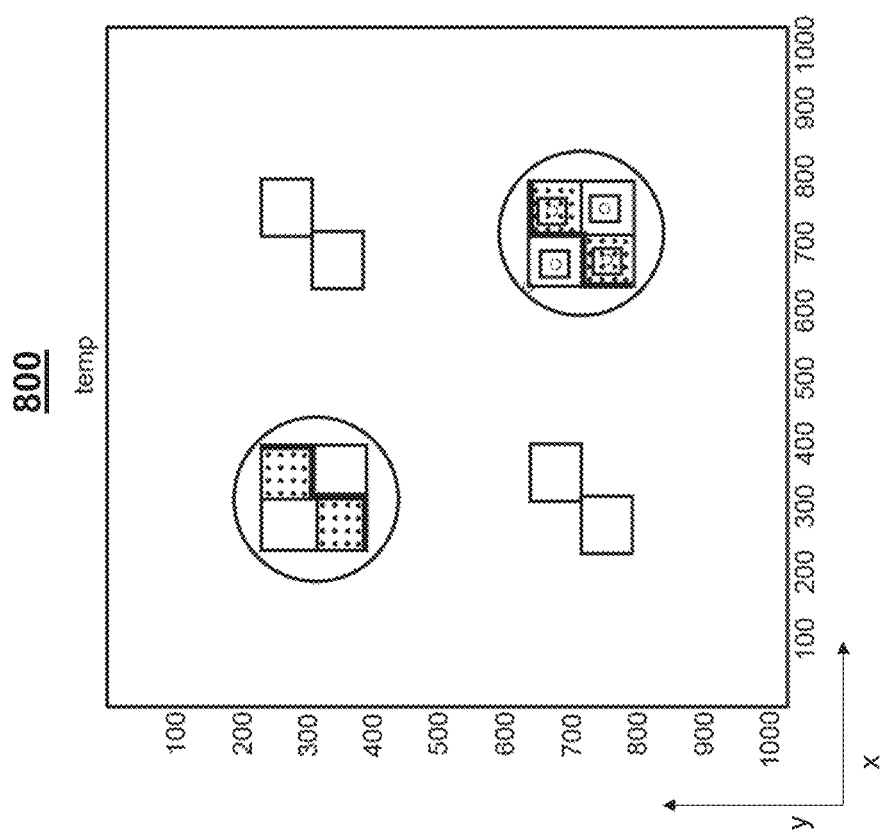
FIG. 8A is an illustrative graph of an image representing a parameter of interest measured using the inspection apparatus of FIG. 4, in accordance with various embodiments.

FIG. 8A is an illustrative graph of an image representing a parameter of interest measured using the inspection apparatus of FIG. 4, in accordance with various embodiments. In the illustrative embodiment, image 800 includes two spots, each corresponding to a zero-th order field image. Image 800 may correspond to an example image, where imaging system 20 generates image data representing image 800 based on the asymmetric components of the reflected converted illumination beam received by image device 414, as described above. The two spots reflect an image stemming from an illumination beam generated by source 402 that is incident on target T from the right, while being detected from the left, while the other spot reflects an image stemming from the illumination being incident on target T from the left and being detected from the right. If no asymmetry were present within the one or more features of target T, then the intensity distributions of each spot would be equal. However, if an associated parameter of interest stemming from asymmetry of the one or more features (e.g., overlay) is present, then a difference in the intensity distribution would be visible. Furthermore, the two spots are spread out within the displayed image due to wedge element 416, which offsets the placement of each spot slightly so that each image is visible. In other words, without wedge element 416 being present, multiple imaging processes would be needed, otherwise the two (or more) spots would overlap within image 800.

FIG. 8B is an illustrative diagram of an exemplary path of a particle being offset by a wedge element after passing through a filter component, in accordance with various embodiments. As seen within scenario 850 of FIG. 8B, when the reflected converted illumination beam passes through second filter component 410b, after being redirected by beam splitter 412, the reflected converted illumination beam passes through second filter component 410b. At second filter component 410b, particles of illumination beam, depending on the orientation and angle with which they scatter off the one or more features of target T, will pass through various segments of second filter component 410b. Depending on the segment of second filter component 410b that a particular particle passes through, that particle will be directed toward a corresponding wedge quarter of wedge element 416. In the illustrative embodiment, wedge element 416 is aligned with second filter component 410b along a central axis C.

Figure 9:
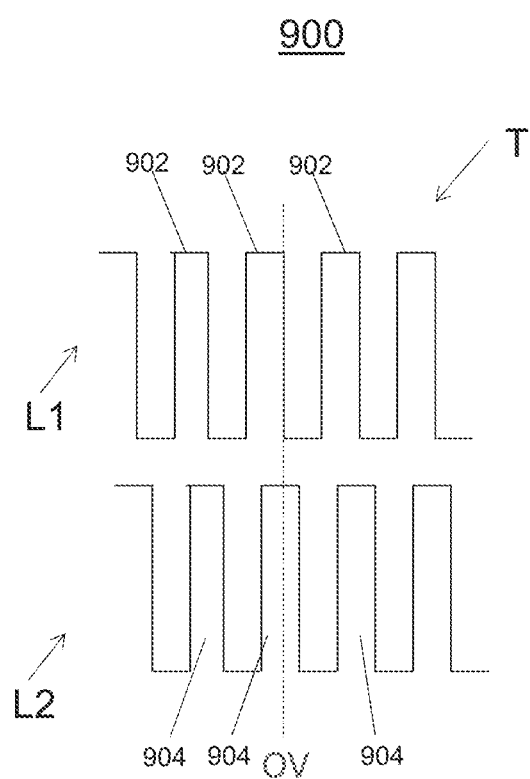
FIG. 9 is an illustrative diagram of an overlay between two layers of a substrate, in accordance with various embodiments.

Wedge element 416 may be configured to cause a particle passing there through to be directed at an angle β relative to an angle of incident on wedge element 416. For instance, wedge element 416 may be composed of wedge quarters, each capable of diverting an incident particle at angle β in the positive-y direction, as well as in another angle along the x-axis. Therefore, wedge element 416 may separate out each particle that passes through each of wedge quarters 416a-d into four quadrants of imaging device 414, thus producing four separate spots within an image (e.g., in the example of FIG. 8A, only two spots are shown within image 800). In other words, wedge element 416 may offset a first part of the portion of the illumination beam that passes through a first segment of second filter component 410b by an angle β relative to an angle of incidence on wedge element 416, as well as offset a second part of the portion of the illumination beam that passes through a second segment of second filter component 410b by angle β. By doing so, the image 800 represented by the image data generated by imaging system 20 includes a first spot representative of the first part and a second spot representative of the second part FIG. 9 is an illustrative diagram of an overlay between two layers of a substrate, in accordance with various embodiments. Scenario 900, in the illustrative embodiment, includes a side-profile of two layers of a target T, and may depict an example parameter of interest (e.g., overlay) that may be measured using the aforementioned techniques. Target T may include a first layer L1 and a second layer L2. Layers L1 and L2 may each include one or more features arranged in a pattern. Layers L1 and L2 are separated by a distance, and target T may include additional layers above and/or below layers L1 and L2, respectively, each separated by the same distance or a slightly different distance.

In one embodiment, each layer's features corresponds to a grating—which may be substantially block-like configurations, however this is merely exemplary. For instance, layer L1 may include one or more features 902 and layer L2 may include one or more features 904. In scenario 900, an overlay OV exists between features 902 and 904 of first layer L1 and second layer L2, respectively. Additional overlays may exist between features of other layers of target T. Scenario 900, therefore, depicts a single overlay for simplicity and is not intended to be limiting. In an embodiment, overlay OV is shown as being one dimensional, however persons of ordinary skill in the art will recognize that overlay may also exists in additional dimensions, and the aforementioned is merely illustrative.

Figure 10:
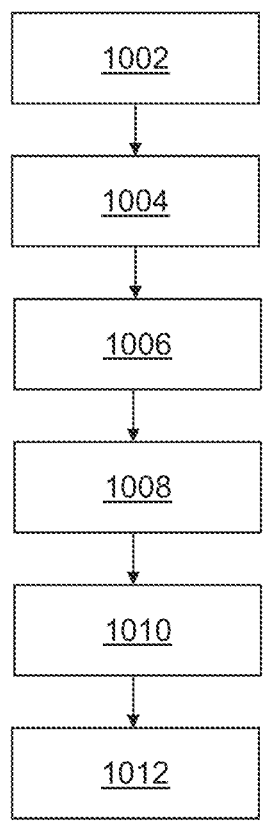
FIG. 10 is an illustrative flowchart of an exemplary process for applying a two-stage filtering technique in conjunction with an inspection apparatus to measure a parameter of interest, in accordance with various embodiments.

FIG. 10 is an illustrative flowchart of an exemplary process for applying a two-stage filtering technique in conjunction with an inspection apparatus to measure a parameter of interest, in accordance with various embodiments. In a non-limiting embodiment, process 1000 may begin at step 1002. At step 1002, an optical system may output an illumination beam having one or more characteristics. For instance, optical system 200 may include source 402, which may generate an illumination beam (e.g., light) having certain characteristics (e.g., diameter of approximately 400 µm, a particular wavelength, etc.), which may be directed via inspection apparatus 400 to target T. The illumination beam may be employed to measure a parameter of interest, such as overlay, CD, etc., associated with one or more features located on target T.

At step 1004, a first filter component may be used to apply a first polarization configuration to the illumination beam. For example, first filter component 410a may apply a first polarization to the illumination beam. The illumination beam, as seen from FIG. 4, may be directed to first filter component 410a using one or more reflection components (e.g., reflection components 404a-c) as well as using one or more lenses (e.g., lenses 406a-c). The first polarization, in some embodiments, may cause the incoming illumination beam to polarize the radiation such that the output radiation is polarized in a first manner. For instance, as seen in FIGS. 6A-7B, first filter component 410a may be segmented into multiple segments, where each segment has a particular polarization configuration such that the polarization configuration at each point of first filter component 410a is point symmetric with respect to a center of first filter component 410a. For example, as seen in FIG. 7A, first filter component 410a may include four segments of substantially similar size and shape 700a-d. First segment 700a may be s-polarized, and the symmetric segment, segment 700b, may also be s-polarized. Third segment 700c and fourth segment 700d, which are symmetric with respect to the center of filter component 410a, may each be p-polarized. Thus, radiation passing through segments 700a and 700b may be s-polarized, whereas radiation passing through segments 700c and 700d may be p-polarized.

At step 1006, the polarized illumination beam may be incident on the one or more features of the target, and may scatter off the one or more features. As the radiation scatters, it is converted from its original polarization to its orthogonal polarization. For example, if an asymmetry is present for the one or more features (e.g., an overlay), incoming radiation that is s-polarized will be reflected as p-polarized. In some embodiments, at least a portion of the converted illumination beam, which may also be referred to as a scattered illumination beam, may be directed back toward beam splitter 412. For example, after scattering off the one or more features of target T, the scattered illumination beam may be re-directed back in substantially opposite direction with respect to the angle of incidence. Furthermore, any asymmetry in the one or more features may be related to changes in polarization for a corresponding portion of the illumination beam incident on target T. In some embodiments, the reflected radiation that is reflected off the one or more features of the target corresponds to the $0^{th}$ order radiation.

Furthermore, if the directionality of the radiation was reversed, and the polarity switched, then no difference would be detected. For instance, radiation incoming at an incoming angle $\Theta$ with respect to the one or more features that is s-polarized will be reflected as p-polarized radiation at an outgoing angle $\Theta$ (e.g., angle of incidence equals angle of reflection). P-polarized radiation incoming at an angle equal to the outgoing angle $\Theta$ is then reflected at the incoming angle $\Theta$ and is s-polarized. Therefore, to measure asymmetry, a comparison may be made to incoming radiation polarized with a first polarization and that is outgoing with a second polarization, with radiation from the opposite direction incoming with the first polarization and outgoing with the second polarization. This process to measure asymmetry may be referred to as "cross polarization detection."

At step 1008, the converted illumination beam may be received at a beam splitter and redirected in a direction perpendicular to the direction of the polarized illumination beam that was directed towards the target. For instance, the portion of the illumination beam that scatters off the one or more features of target T, and that\s polarization was converted as described above, may be incident on beam splitter 412. Upon incidence, the converted illumination beam may be redirected in a direction orthogonal to the initial direction of the polarized illumination beam that passed through first filter component 410a.

At step 1010, a second filtering configuration may be applied to the converted illumination beam using a second filter component. For example, second filter component 410b may apply a second polarization to the converted illumination beam. The second polarization, in some embodiments, may cause the incoming converted illumination beam to polarize the radiation such that the output radiation is polarized in a second manner. For instance, as seen in FIGS. 6A-7B, second filter component 410b may be segmented into multiple segments, where each segment has a particular polarization configuration such that the polarization configuration at each point of first filter component 410b is point symmetric with respect to a center of first filter component 410b. For example, as seen in FIG. 7B, first filter component 410b may include four segments 750a-d of substantially similar size and shape. First segment 750a may be p-polarized, and the symmetric segment, segment 750b, may also be p-polarized. Third segment 750c and fourth segment 750d, which are symmetric with respect to the center of filter component 410b, may each be s-polarized. Thus, radiation passing through segments 750a and 750b may be p-polarized, whereas radiation passing through segments 750c and 750d may be s-polarized.

By applying second filter component 410b at an angle perpendicular to the orientation of first filter component 410a, and having a cross-polarization configuration (e.g., orthogonal polarization) with respect to first filter component 410a, any radiation that passes through second filter component 410b is cross-polarized. Radiation incident on target T that is s-polarized, and that reflects off the target and is also s-polarized, will not include any information associated with asymmetry of the one or more features. Thus, the remaining signal after application of the second polarization configuration includes information associated with a parameter of interest to be measured.

At step 1012, intensity data representing intensities of the portion of the illumination beam that is not blocked by second filter component 410b may be detected by an imaging system 20. For instance, intensity data representing intensities of a portion of the co-polarized radiation signal may be detected by imaging device 414 of imaging system 20. Imaging device 414 may then be configured to render one or more images of the target representative of an amount of asymmetry associated with the one or more features of target T.

Figure 11:
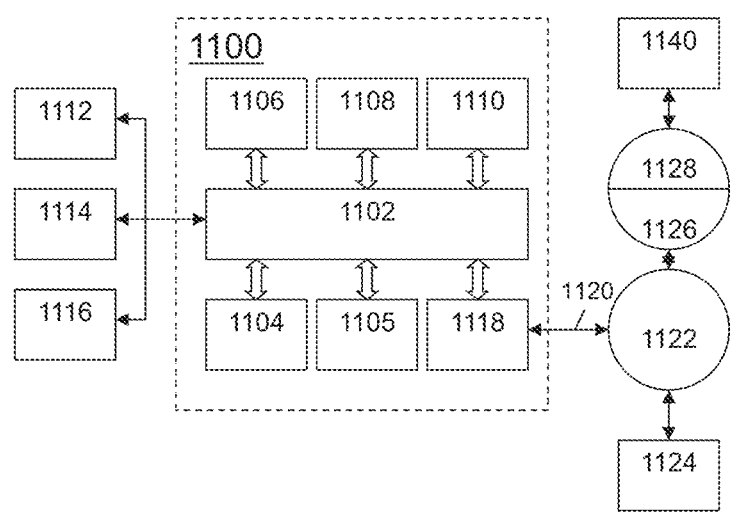
FIG. 11 is an illustrative diagram of an exemplary computing system, in accordance with various embodiments.

FIG. 11 is an illustrative diagram of an exemplary computing system, in accordance with various embodiments. Referring to FIG. 11, a computer system 1100 is shown. The computer system 1100 includes a bus 1102 or other communication mechanism for communicating information, and a processor 1104 (or multiple processors 1104 and 1105) coupled with bus 1102 for processing information. Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a cathode ray tube (CRT) or flat panel or touch panel display for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane. A touch panel (screen) display may also be used as an input device.

The computer system 1100 may be suitable to function as a processing unit herein in response to processor 1104 executing one or more sequences of one or more instructions contained in main memory 1106. Such instructions may be read into main memory 1106 from another computer-readable medium, such as storage device 1110. Execution of the sequences of instructions contained in main memory 1106 causes processor 1104 to perform a process described herein. One or more processors in a multi-processing arrangement may also be employed to execute the sequences of instructions contained in main memory 1106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 1104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 1106. Transmission media include coaxial cables, copper wire and fiber optics, including the wires that comprise bus 1102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1104 for execution. For example, the instructions may initially be borne on a magnetic disk of a remote computer. The remote computer can load the instructions into its dynamic memory and send the instructions over a telephone line using a modem. A modem local to computer system 1100 can receive the data on the telephone line and use an infrared transmitter to convert the data to an infrared signal. An infrared detector coupled to bus 1102 can receive the data carried in the infrared signal and place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 may also include a communication interface 1118 coupled to bus 1102. Communication interface 1118 provides a two-way data communication coupling to a network link 1120 that is connected to a local network 1122. For example, communication interface 1118 may be an integrated services digital network (ISDN) card or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic or optical signals that carry digital data streams representing various types of information.

Network link 1120 typically provides data communication through one or more networks to other data devices. For example, network link 1120 may provide a connection through local network 1122 to a host computer 1124 or to data equipment operated by an Internet Service Provider (ISP) 1126. ISP 1126 in turn provides data communication services through the worldwide packet data communication network, now commonly referred to as the "Internet" 1128. Local network 1122 and Internet 1128 both use electrical, electromagnetic or optical signals that carry digital data streams. The signals through the various networks and the signals on network link 1120 and through communication interface 1118, which carry the digital data to and from computer system 1100, are exemplary forms of carrier waves transporting the information.

Computer system 1100 can send messages and receive data, including program code, through the network(s), network link 1120, and communication interface 1118. In the Internet example, a server 1140 might transmit a requested code for an application program through Internet 1128, ISP 1126, local network 1122 and communication interface 1118. In accordance with one or more embodiments, one such downloaded application provides for a method as disclosed herein, for example. The received code may be executed by processor 1104 as it is received, and/or stored in storage device 1110, or other non-volatile storage for later execution. In this manner, computer system 1100 may obtain application code in the form of a carrier wave.

Further embodiments are described in the below numbered clauses:

1. An inspection apparatus, comprising:
   an optical system configured to output an illumination beam to be incident on a target comprising one or more features, the illumination beam configured to comprise a first polarization when incident on the target; and
   an imaging system configured to:
      obtain intensity data representing at least a portion of the illumination beam scattered by the one or more features, wherein the portion of the illumination beam comprises a second polarization orthogonal to the first polarization,
      generate image data representing an image of each of the one or more features based on the intensity data, and
      determine a measurement of a parameter of interest associated with the one or more features based on an amount of the portion of the illumination beam having the second polarization.

2. The inspection apparatus of clause 1, further comprising:
   a first filter component configured and arranged such that the illumination beam passes through the first filter component and is directed at the target, the first filter component causing the illumination beam to be polarized with the first polarization prior to being incident on the target; and
   a second filter component configured and arranged orthogonal to the first filter component such that the second filter component receives the portion of the illumination beam, the second filter component causing the portion of the illumination beam to be polarized with the second polarization.

3. The inspection apparatus of clause 2, wherein:
   the first filter component comprises a first segment configured to polarize light to have the first polarization, a second segment configured to polarize light to have the second polarization, a third segment configured to polarize light to have the second polarization, and a fourth segment configured to polarize light to have the first polarization;
   the second filter component comprises a fifth segment configured to polarize light to have the second polarization, a sixth segment configured to polarize light to have the first polarization, a seventh segment configured to polarize light to have the first polarization, and an eighth segment configured to polarize light to have the second polarization; and
   the first filter component and the second filter component are oriented such that radiation associated with the illumination beam passing through the first segment will pass through the eighth segment, radiation associated with the illumination beam passing through the second segment will pass through the seventh segment, radiation associated with the illumination beam passing through the third segment will pass through the sixth segment, and radiation associated with the illumination beam passing through the fourth segment will pass through the fifth segment.

4. The inspection apparatus of clause 3, wherein the first filter component and the second filter component comprise one of: s and p polarization filters, H and V polarization filters, left circular and right circular polarization filters, or left elliptical and right elliptical polarization filters.

5. The inspection apparatus of clause 2, wherein the second filter component comprises at least a first segment and a second segment, and the inspection apparatus further comprises:
   a wedge element configured and arranged in alignment with the second filter component and further configured to:
      offset first particles of the portion of the illumination beam that pass through the first segment of the second filter component at a first angle relative to an angle of incidence of the first particles on the wedge element, and
      offset second particles of the portion of the illumination beam that passes through the second segment of the second filter component at a second angle relative to an angle of incidence of the second particles on the wedge element, wherein the image represented by the image data includes a first spot representative of the first particles offset by the first angle and a second spot representative of the second particles offset by the second angle.

6. The inspection apparatus of clause 5, wherein the image represented by the image data comprises four spots within the image each offset from one another and representative of:
   the illumination beam passing through each of the first segment, second segment, third segment, and fourth segment and scattering off of the one or more features; and
   the portion of the illumination beam passing through a corresponding one of the fifth segment, sixth segment, seventh segment, and eighth segment.

7. The inspection apparatus of clause 1, further comprising:
   a first filter component having a first polarization configuration; and
   a second filter component having a second polarization configuration, wherein the second polarization configuration is orthogonal to the first polarization configuration.

8. The inspection apparatus of clause 7, wherein:
   the first filter component comprises a first half and a second half, the second half being point symmetric with respect to a center of the first filter component as compared to the first half; and
   the second filter component comprises a third half and a fourth half, the fourth half being point symmetric with respect to a center of the second filter component as compared to the third half.

9. The inspection apparatus of clause 7, wherein:
   the first filter component is substantially circular and comprises four equally sized segments;
   the second filter component is substantially circular and comprises four equally sized segments;
   the first polarization configuration comprises each of the four equally sized segments and operable to polarize light that passes through one of the four equally sized segments in the first polarization or the second polarization, such that each of the fourth equally sized segments' polarization is point symmetric with respect to a center of the first filter component; and
   the second polarization configuration comprises each of the four equally sized segments operable to polarize light that passes through one of the four equally sized segments in the first polarization or the second polarization, such that each of the four equally sized segments' polarization is point symmetric with respect to a center of the second filter component and orthogonal to a corresponding segment of the first filter component.

10. A method, comprising:
    outputting an illumination beam from an optical system to be incident on a target comprising one or more features;
    applying a first polarization to the illumination beam using a first filter component;
    applying a second polarization to at least a portion of the illumination beam that scatters off the one or more features using a second filter component, wherein the second filter component is located orthogonal to the first filter component;
    obtaining, by an imaging system, intensity data representing at least the portion of the illumination beam;
    generating image data representing an image of each of the one or more features based on the intensity data; and
    determining a measurement of a parameter of interest associated with the one or more features based on an amount of the portion of the illumination beam having the second polarization.

11. The method of clause 10, wherein:
    applying the first polarization comprises causing the illumination beam to be polarized with the first polarization prior to being incident on the target; and
    applying the second polarization comprises causing the portion of the illumination beam to be polarized with the second polarization prior to being received by the imaging system.

12. The method of clause 10, wherein applying the second polarization comprises:
    facilitating radiation associated with the illumination beam that passed through a first segment of the first filter component to pass through a first segment of the second filter component;
    facilitating radiation associated with the illumination beam that passed through a second segment of the first filter component to pass through a second segment of the second filter component;
    facilitating radiation associated with the illumination beam that passed through a third segment of the first filter component to pass through a third segment of the second filter component; and
    facilitating radiation associated with the illumination beam that passed through a fourth segment of the first filter component to pass through a fourth segment of the second filter component, wherein:
       the first segment of the first filter component, the fourth segment of the first filter component, the third segment of the second filter component, and the second segment of the second filter component are configured to polarize light to have the first polarization, and
       the second segment of the first filter component, the third segment of the first filter component, the first segment of the second filter component, and the fourth segment of the second filter component are configured to polarize light to have the second polarization, the second polarization being orthogonal to the first polarization.

13. The method of clause 10, further comprising:
    offsetting, prior to the intensity data being obtained and via a wedge element configured and arranged in alignment with the second filter component, first particles of a portion of the illumination beam that pass through a first segment of the second filter component at a first angle relative to an angle of incidence of the first particles on the wedge element; and
    offsetting second particles of a portion of the illumination beam that pass through a second segment of the second filter component at a second angle relative to an angle of incidence of the second particles on the wedge element, wherein the image represented by the image data includes a first spot representative of the first particles offset by the first angle and a second spot representative of the second particles offset 14. The method of clause 13, wherein generating the image data comprises generating four spots within the image each offset from one another and representative of:

the illumination beam passing through each of a first segment of the first filter component, a second segment of the first filter component, a third segment of the first filter component, and a fourth segment of the first filter component, and scattering off of the one or more features; and the portion of the illumination beam passing through the one of the first segment of the second filter component, the second segment of the second filter component, a third segment of the second filter component, and a fourth segment of the second filter component.

15. A system, comprising:

an optical system configured to output an illumination beam;

a first filter component configured to receive the illumination beam and apply a first polarization to the illumination beam such that the illumination beam, after passing through the first filter component, is polarized with the first polarization;

a target comprising one or more features, wherein the illumination beam having the first polarization is incident on the target, and at least a portion of the illumination beam scattered by the one or more features comprises a second polarization orthogonal to the first polarization; and a second filter component configured to receive the portion of the illumination beam comprising the second polarization, wherein the second filter component is configured to apply a second polarization to the portion of the illumination beam such that, after passing through the second filter component, a remaining portion of the illumination beam is associated with an amount of the remaining portion of the illumination beam that has the second polarization, and is representative of a parameter of interest associated with the one or more features.

16. The optical system of clause 15, wherein:

the first filter component comprises at least a first segment configured to polarize light to have the first polarization, and a second segment configured to polarize light to have the second polarization; and the second filter component comprises at least a third segment configured polarize light to have the second polarization, and a fourth segment configured to polarize light to have the first polarization, the first polarization being orthogonal to the second polarization.

17. The optical system of clause 15, wherein:

the first filter component comprises:
a first segment and a second segment each configured to polarize light to have the first polarization, and
a third segment and a fourth segment each configured to polarize light to have the second polarization; and
the second filter component comprises:
a fifth segment and a sixth segment each configured to polarize light to have the first polarization, and
a seventh segment and an eighth segment each configured to polarize light to have the second polarization, the first polarization being orthogonal to the second polarization.

18. The optical system of clause 15, wherein:

the first filter component is segmented in half such that each point of the first filter component has a polarization orthogonal to a symmetric point of the first filter component with respect to a center of the first filter component; and the second filter component is segmented in half such that each point of the second filter component has a polarization orthogonal to a symmetric point of the second filter component with respect to a center of the second filter component and an orthogonal polarization of a corresponding point on the first filter component.

19. The optical system of clause 15, further comprising:

a wedge element configured and arranged in alignment with the second filter component and further configured to:
offset first particles of a portion of the illumination beam that pass through a first segment of the second filtering component at a first angle relative to an angle of incidence of the first particles on the wedge element, and
offset second particles of a portion of the illumination beam that passes through a second segment of the second filtering component at a second angle relative to an angle of incidence of the second particles on the wedge element, wherein the image represented by the image data includes a first spot representative of the first particles offset by the first angle and a second spot representative of the second particles offset by the second angle.

20. The optical system of clause 15, wherein:

the first filter component is substantially circular and comprises four equally sized segments;

the second filter component is substantially circular and comprises four equally sized segments;

each of the four equally sized segments of the first filter component is configured to polarize light passing through a corresponding one of the four equally sized segments of the first filter component with the first polarization or the second polarization such that a polarization of each of the four equally sized segments of the first filter component is point symmetric with respect to a center of the first filter component; and each of the four equally sized segments of the second filter component is configured to polarize light passing through a corresponding one of the four equally sized segments of the second filter component with the first polarization or the second polarization such that each of the four equally sized segments of the second filter component is point symmetric with respect to a center of the second filter component and opposite of a corresponding segment of the first filter component.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. An inspection apparatus, comprising:
a first filter component configured and arranged to output an illumination beam having a first polarization and a second polarization prior to being incident on a target comprising one or more features, the first filter component having a first part configured to output radiation with a first polarization configuration comprising the first polarization and the second polarization and having a second part configured to output radiation with a second polarization configuration different than the first polarization configuration;
a second filter component configured and arranged orthogonal to the first filter component such that the second filter component receives radiation of the illumination beam from the target; and
an imaging system configured to:
obtain intensity data representing at least a portion of the illumination beam comprising the first polarization scattered by the one or more features, wherein the scattered at least portion of the illumination beam comprises a polarization orthogonal to the first polarization,
generate image data representing an image of each of the one or more features based on the intensity data, and
determine a measurement of a parameter of interest associated with the one or more features based on an amount of the scattered at least portion of the illumination beam having the polarization orthogonal to the first polarization.

2. The inspection apparatus of claim 1, wherein the second filter component comprises at least a first segment and a second segment, and the inspection apparatus further comprises:
a wedge element configured and arranged in alignment with the second filter component and further configured to:
offset first particles of a portion of the illumination beam that pass through the first segment of the second filter component at a first angle relative to an angle of incidence of the first particles on the wedge element, and
offset second particles of a portion of the illumination beam that passes through the second segment of the second filter component at a second angle relative to an angle of incidence of the second particles on the wedge element, wherein the image represented by the image data includes a first spot representative of the first particles offset by the first angle and a second spot representative of the second particles offset by the second angle.

3. The inspection apparatus of claim 1, wherein:
the first filter component comprises a first half and a second half, the second half being point symmetric with respect to a center of the first filter component as compared to the first half; and
the second filter component comprises a third half and a fourth half, the fourth half being point symmetric with respect to a center of the second filter component as compared to the third half.

4. The inspection apparatus of claim 1, wherein:
the first filter component is substantially circular and comprises four equally sized segments;
the second filter component is substantially circular and comprises four equally sized segments;
the first and second polarization configurations comprises each of the four equally sized segments and operable to polarize radiation that passes through one of the four equally sized segments in the first polarization or the second polarization, such that each of the four of the first filter component equally sized segments' polarization is point symmetric with respect to a center of the first filter component; and
a third polarization configuration of the second filter component comprises each of the four equally sized segments of the second filter component operable to polarize radiation that passes through one of the four equally sized segments in the first polarization or the second polarization, such that each of the four equally sized segments' polarization is point symmetric with respect to a center of the second filter component and orthogonal to a corresponding segment of the first filter component.

5. The inspection apparatus of claim 1, wherein:
the first filter component comprises a first segment configured to polarize radiation to have the first polarization, a second segment configured to polarize radiation to have the second polarization, a third segment configured to polarize radiation to have the second polarization, and a fourth segment configured to polarize radiation to have the first polarization;
the second filter component comprises a fifth segment configured to polarize radiation to have the second polarization, a sixth segment configured to polarize radiation to have the first polarization, a seventh segment configured to polarize radiation to have the first polarization, and an eighth segment configured to polarize radiation to have the second polarization; and
the first filter component and the second filter component are oriented such that radiation associated with the illumination beam passing through the first segment will pass through the eighth segment, radiation associated with the illumination beam passing through the second segment will pass through the seventh segment, radiation associated with the illumination beam passing through the third segment will pass through the sixth segment, and radiation associated with the illumination beam passing through the fourth segment will pass through the fifth segment.

6. The inspection apparatus of claim 5, wherein the first filter component and the second filter component comprise one of: s and p polarization filters, H and V polarization filters, left circular and right circular polarization filters, or left elliptical and right elliptical polarization filters.

7. The inspection apparatus of claim 5, wherein the image represented by the image data comprises four spots within the image each offset from one another and representative of:
the illumination beam passing through each of the first segment, second segment, third segment, and fourth segment and scattering off of the one or more features; and the portion of the illumination beam passing through a corresponding one of the fifth segment, sixth segment, seventh segment, and eighth segment.

8. A method, comprising:
outputting an illumination beam from a first filter component, the first filter component configured and arranged to output the illumination beam with a first polarization and a second polarization prior to being incident on a target comprising one or more features, the first filter component having a first part configured to output radiation with a first polarization configuration comprising the first polarization and the second polarization and having a second part configured to output radiation with a second polarization configuration different than the first polarization configuration;
receiving, at a second filter component, radiation of the illumination beam from the target, the second filter component configured and arranged orthogonal to the first filter component;
obtaining, by an imaging system, intensity data representing a portion of the illumination beam comprising the first polarization scattered by the one or more features, wherein the scattered at least portion of the illumination beam comprises a polarization orthogonal to the first polarization;
generating image data representing an image of each of the one or more features based on the intensity data; and
determining a measurement of a parameter of interest associated with the one or more features based on an amount of the scattered at least portion of the illumination beam having the polarization orthogonal to the first polarization.

9. The method of claim 8, wherein receiving, at the second filter component, radiation from the target comprises:
facilitating radiation associated with the illumination beam that passed through a first segment of the first filter component to pass through a first segment of the second filter component;
facilitating radiation associated with the illumination beam that passed through a second segment of the first filter component to pass through a second segment of the second filter component;
facilitating radiation associated with the illumination beam that passed through a third segment of the first filter component to pass through a third segment of the second filter component; and
facilitating radiation associated with the illumination beam that passed through a fourth segment of the first filter component to pass through a fourth segment of the second filter component, wherein:
the first segment of the first filter component, the fourth segment of the first filter component, the third segment of the second filter component, and the second segment of the second filter component are configured to polarize radiation to have the first polarization, and
the second segment of the first filter component, the third segment of the first filter component, the first segment of the second filter component, and the fourth segment of the second filter component are configured to polarize radiation to have the second polarization, the second polarization being orthogonal to the first polarization.

10. The method of claim 8, further comprising:
offsetting, prior to the intensity data being obtained and via a wedge element configured and arranged in alignment with the second filter component, first particles of a portion of the illumination beam that pass through a first segment of the second filter component at a first angle relative to an angle of incidence of the first particles on the wedge element; and
offsetting second particles of a portion of the illumination beam that pass through a second segment of the second filter component at a second angle relative to an angle of incidence of the second particles on the wedge element, wherein the image represented by the image data includes a first spot representative of the first particles offset by the first angle and a second spot representative of the second particles offset by the second angle.

11. The method of claim 10, wherein generating the image data comprises generating four spots within the image each offset from one another and representative of:
the illumination beam passing through each of a first segment of the first filter component, a second segment of the first filter component, a third segment of the first filter component, and a fourth segment of the first filter component, and scattering off of the one or more features; and
the portion of the illumination beam passing through the one of the first segment of the second filter component, the second segment of the second filter component, a third segment of the second filter component, and a fourth segment of the second filter component.

12. A system, comprising:
a first filter component having a first part configured to output an illumination beam with a first polarization configuration comprising a first polarization and a second polarization and having a second part configured to output the illumination beam with a second polarization configuration different than the first polarization configuration; and
a second filter component configured to receive radiation of the illumination beam from a target comprising one or more features,
wherein at least part of the illumination beam having the first polarization is incident on the target and is converted, at the target, to a polarization orthogonal to the first polarization, and
wherein the second filter component is configured to block radiation of the illumination beam that had the first polarization when incident on the target but to allow radiation converted to the polarization orthogonal to the first polarization to pass such that, after passing through the second filter component, a remaining portion of the illumination beam is associated with an amount of the remaining portion of the illumination beam that was converted to the polarization orthogonal to the first polarization, and is representative of a parameter of interest associated with the one or more features.

13. The system of claim 12, wherein:
the first filter component comprises at least a first segment configured to polarize radiation to have the first polarization, and a second segment configured to polarize radiation to have the second polarization; and
the second filter component comprises at least a third segment configured polarize radiation to have the second polarization, and a fourth segment configured to polarize radiation to have the first polarization, the first polarization being orthogonal to the second polarization.

14. The system of claim 12, wherein:
the first filter component comprises:
- a first segment and a second segment each configured to polarize radiation to have the first polarization, and
- a third segment and a fourth segment each configured to polarize radiation to have the second polarization; and the second filter component comprises:
- a fifth segment and a sixth segment each configured to polarize radiation to have the first polarization, and
- a seventh segment and an eighth segment each configured to polarize radiation to have the second polarization, the first polarization being orthogonal to the second polarization.

15. The system of claim 12, wherein:
the first filter component is segmented in half such that each point of the first filter component has a polarization orthogonal to a symmetric point of the first filter component with respect to a center of the first filter component; and
the second filter component is segmented in half such that each point of the second filter component has a polarization orthogonal to a symmetric point of the second filter component with respect to a center of the second filter component and an orthogonal polarization of a corresponding point on the first filter component.

16. The system of claim 12, further comprising:
a wedge element configured and arranged in alignment with the second filter component and further configured to:
- offset first particles of a portion of the illumination beam that pass through a first segment of the second filtering component at a first angle relative to an angle of incidence of the first particles on the wedge element, and
- offset second particles of a portion of the illumination beam that passes through a second segment of the second filtering component at a second angle relative to an angle of incidence of the second particles on the wedge element, wherein the image represented by the image data includes a first spot representative of the first particles offset by the first angle and a second spot representative of the second particles offset by the second angle.

17. The system of claim 12, wherein:
the first filter component is substantially circular and comprises four equally sized segments;
the second filter component is substantially circular and comprises four equally sized segments;
each of the four equally sized segments of the first filter component is configured to polarize radiation passing through a corresponding one of the four equally sized segments of the first filter component with the first polarization or the second polarization such that a polarization of each of the four equally sized segments of the first filter component is point symmetric with respect to a center of the first filter component; and
each of the four equally sized segments of the second filter component is configured to polarize radiation passing through a corresponding one of the four equally sized segments of the second filter component with the first polarization or the second polarization such that each of the four equally sized segments of the second filter component is point symmetric with respect to a center of the second filter component and opposite of a corresponding segment of the first filter component.

18. The system of claim 12, wherein the first filter component and the second filter component comprise one of: s and p polarization filters, H and V polarization filters, left circular and right circular polarization filters, or left elliptical and right elliptical polarization filters.

19. The system of claim 12, wherein the first and second filter components form part of an inspection apparatus configured to determine the parameter of interest associated with the one or more features.

20. The system of claim 19, wherein the parameter of interest is one or more selected from: overlay, critical dimension, alignment, focus, and/or dose.

* * * * *